United States Patent
Wilbur

(10) Patent No.: US 6,280,555 B1
(45) Date of Patent: Aug. 28, 2001

(54) METHOD OF FORMING A PRINTED CIRCUIT BOARD

(76) Inventor: Robert L. Wilbur, P.O. Box 57, Bridgton, ME (US) 04009

( * ) Notice: Subject to any disclaimer, the term of this patent is extended or adjusted under 35 U.S.C. 154(b) by 0 days.

(21) Appl. No.: 09/281,651

(22) Filed: Mar. 30, 1999

(51) Int. Cl.[7] ............................. B32B 31/24; C23F 1/00; H05K 3/06
(52) U.S. Cl. ...................... 156/249; 156/230; 156/247; 156/248; 156/256; 216/43; 29/846
(58) Field of Search .................................. 156/230, 247, 156/248, 249, 250, 256; 216/13, 41, 43, 44, 45, 54; 438/689, 745; 29/846, 847

(56) References Cited

U.S. PATENT DOCUMENTS

| | | | |
|---|---|---|---|
| 3,380,863 | * | 4/1968 | Silberberg . |
| 3,607,474 | * | 9/1971 | Hensdale . |
| 3,629,036 | * | 12/1971 | Isaacson ............................ 156/247 X |
| 3,650,860 | * | 3/1972 | Rolker, Jr. . |
| 4,155,801 | * | 5/1979 | Provancher ...................... 156/249 X |
| 4,374,869 | * | 2/1983 | Dorey, II et al. . |
| 4,470,872 | * | 9/1984 | Sudo et al. . |
| 4,621,019 | * | 11/1986 | Vikesland . |
| 4,654,116 | * | 3/1987 | Spacer . |
| 4,717,639 | * | 1/1988 | Dubin et al. . |
| 4,917,926 | * | 4/1990 | Weinhold et al. . |
| 4,983,246 | * | 1/1991 | Bunting . |
| 4,983,252 | * | 1/1991 | Masui et al. . |
| 4,991,287 | * | 2/1991 | Piatt et al. ......................... 29/846 X |
| 5,444,108 | * | 8/1995 | Hagquist et al. . |
| 5,464,692 | * | 11/1995 | Huber . |
| 5,705,082 | * | 1/1998 | Hinson . |
| 5,800,723 | * | 9/1998 | Juskey et al. ...................... 216/41 X |
| 5,972,234 | * | 10/1999 | Weng et al. ........................... 216/44 |
| 6,014,805 | * | 1/2000 | Buixadera Ferrer ............... 216/41 X |

OTHER PUBLICATIONS

Irving Skeist, editor, "Handbook of Adhesives" Third Edition, pp. 336, 641, 659–660, 1990.*

Encyclopedia Britannica, articles on contact adhesives and pressure–sensitive adhesives, britannica.com, 2001.*

* cited by examiner

*Primary Examiner*—Curtis Mayes
(74) *Attorney, Agent, or Firm*—Frederick R. Cantor, Esq.

(57) ABSTRACT

A printed circuit board can be formed by a method that includes the step of cutting a circuit pattern out of a low cost plastic sheet material, and transferring the pattern onto a tape. The tape, with the pattern adhesively attached, is transferred onto a conductive film surface on a dielectric board. Thereafter, the tape is removed, leaving the pattern on the conductive film. An acid-etching step is performed on the exposed areas of the conductive film, after which the pattern is removed from the non-etched areas of the conductive film.

5 Claims, 3 Drawing Sheets

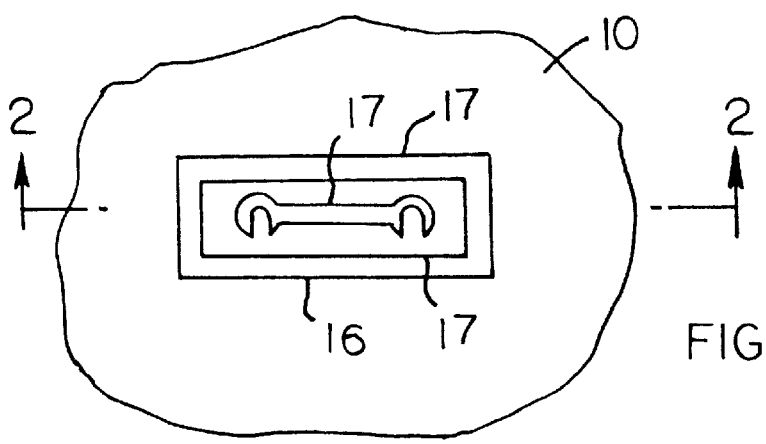
FIG. 1
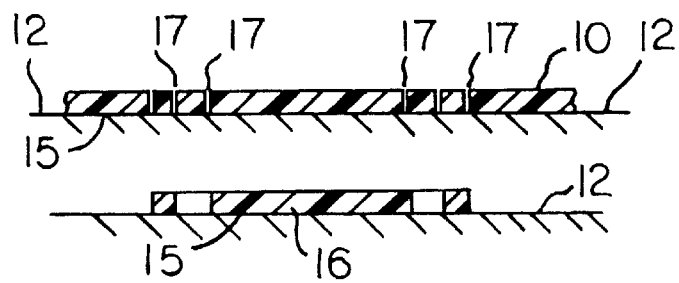
FIG. 2
FIG. 3
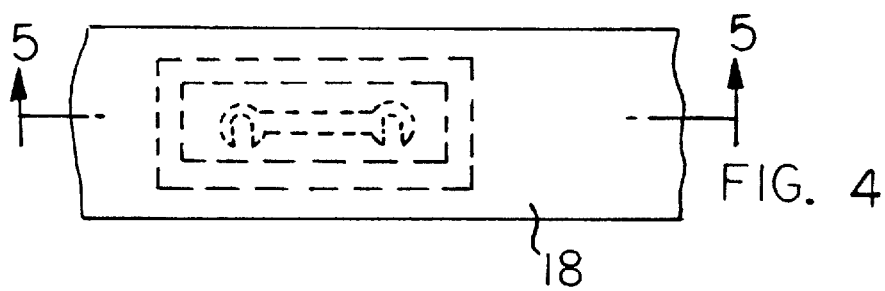
FIG. 4
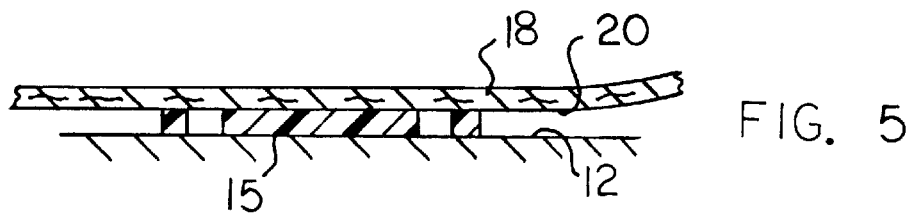
FIG. 5
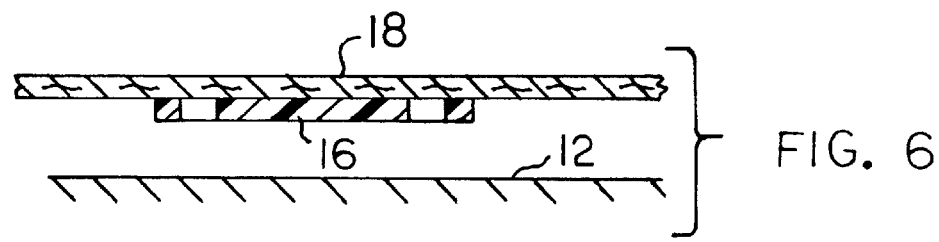
FIG. 6

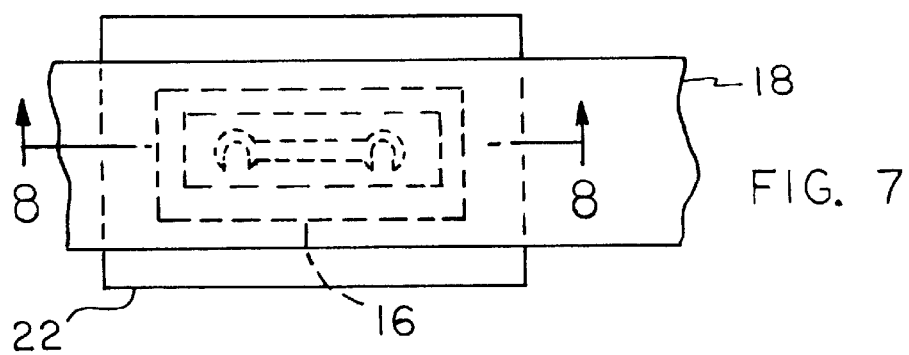
FIG. 7
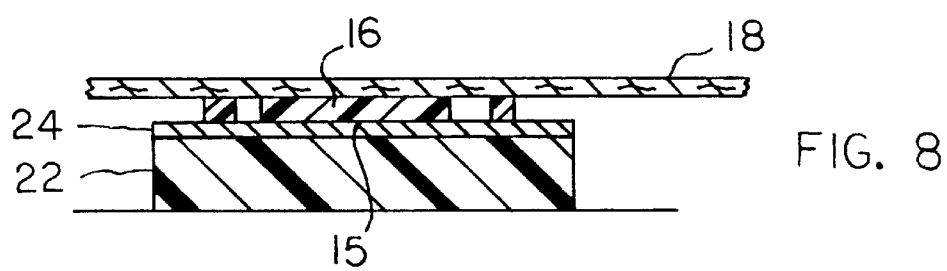
FIG. 8
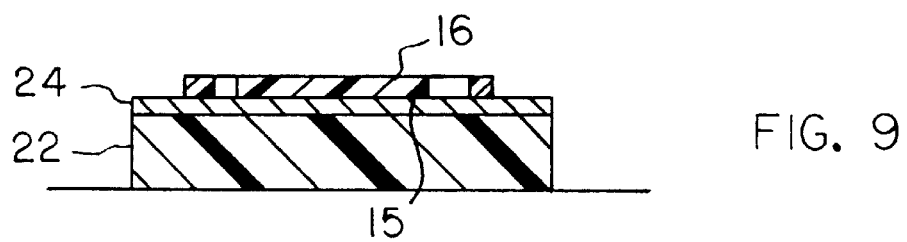
FIG. 9
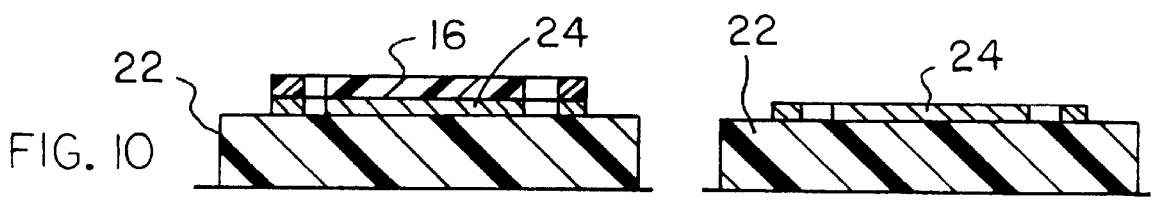
FIG. 10
FIG. 11
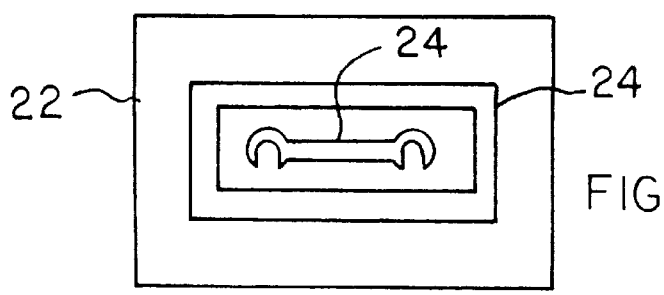
FIG. 12

METHOD OF FORMING A PRINTED CIRCUIT BOARD

BACKGROUND OF THE PRESENT INVENTION

Summary of the Present Invention

This invention relates to a method of forming a printed circuit board, and especially to a method that can be used to build printed circuit boards without special tooling or equipment. The invention is particularly applicable to the fabrication of prototype circuit boards or circuit boards for relatively low volume production (where tooling expense is a major factor).

Circuit boards produced by a mass production process, on a large volume scale, can be fabricated with special tools and dies configured to the particular circuit design that is to be used. However, in many experimental situations it may not be economically feasible to construct special tools and dies. The present invention is concerned with the situation where the circuit designer may want to produce limited numbers of printed circuit boards to meet low volume requirements, or for experimental or prototype purposes.

The present invention relates to a method of forming a printed circuit board, without the use of expensive dies or equipment, thereby minimizing the expense of circuit boards used on an experimental or prototype basis.

In practice of the invention, a circuit pattern is cut out of a flexible (or rigid) sheet of plastic material. Using an adhesive tape, the pattern is transferred to a circuit board having a conductive film thereon. After the tape is removed from the pattern, the exposed areas of the conductive film are removed, as by acid etching. The pattern is then removed form the remaining (unetched) areas of the conductive film, leaving a conductive film of.a desired configuration on the dielectric board.

The process can be performed without special skills or equipment, if desired. Alternately, special cutting equipment (e.g. a computer-controlled laser cutter) can be used to form the pattern. The process lends itself to a certain degree of versatility in the type of equipment that can be used.

Specific features and advantages of the invention will be apparent from the attached figures and description of a method embodying the invention.

In summary, and in accordance with the above discussion, the forgoing objectives are achieved in the following embodiment.

1. A method of forming a printed circuit on a board comprising:
   a. providing a circuit pattern on a conductive film on a circuit board;
   b. removing exposed areas of the conductive film so that the remaining portion of the conductive film has the same configuration as the pattern; and
   c. removing the pattern from the conductive film.

2. The method, as described in paragraph 1, wherein the step removing exposed areas of the conductive film involves the application of an etching material to the conductive film.

3. The method, as described in paragraph 1, wherein the step of providing a circuit pattern on the conductive film involves cutting a circuit pattern out of a flexible sheet, and transferring the pattern onto the conductive film.

4. The method, as described in paragraph 3, wherein the step of transferring the pattern onto the conductive film involves pressing an adhesively-coated tape onto the pattern, transferring the tape and pattern into a position overlying the conductive film, pressing the tape and pattern against the conductive film, and removing the tape from the pattern.

5. A method of forming a printed circuit on a dielectric board comprising:
   a. cutting a circuit pattern out of a flexible sheet, wherein said sheet has a first contact adhesive on a first major face thereof;
   b. pressing a tape against a second major face of said pattern, wherein said tape has a second contact adhesive on the tape surface that is engaged with the pattern;
   c. pressing the tape and pattern against a conductive film on a dielectric circuit board, whereby said first contact adhesive secures the pattern to the conductive film;
   d. separating the tape from the pattern leaving the pattern on the conductive film;
   e. etching exposed areas of the conductive film, to form a conductive layer underneath the pattern; and
   f. removing the pattern from the conductive layer.

6. The method, as described in paragraph 5, wherein the first contact adhesive is stronger than the second adhesive.

7. The method, as described in paragraph 5, wherein said circuit board is formed out of a rigid plastic material, and said conductive film is copper.

8. A method of forming a printed circuit on a dielectric board, comprising:
   a. applying a first contact adhesive to a first major surface of a flexible masking sheet;
   b. temporarily attaching the masking sheet to a glossy surface by bringing the adhesive surface of the sheet into engagement with the glossy surface;
   c. cutting a circuit pattern out of said masking sheet;
   d. removing areas of said masking sheet, leaving a pattern on the glossy surface;
   e. providing a tape having a second contact adhesive on one of the tape major surfaces;
   f. bringing the tape into contact with the pattern so that the second contact adhesive is engaged with the exposed surface of the pattern;
   g. lifting the tape and pattern off the glossy surface;
   h. providing a dielectric circuit board with a conductive film on a major surface of the board;
   i. transferring the tape and pattern to the circuit board by bringing the adhesive surface of the pattern into engagement with the conductive film;
   j. removing the tape from the pattern, leaving the pattern adhesively attached to the conductive film;
   k. etching the exposed areas of the conductive film, to form a conductive layer underneath the pattern; and
   l. removing the pattern from the conductive layer.

9. The method, as described in paragraph 8, wherein the first contact adhesive is stronger than the second contact adhesive.

BRIEF DESCRIPTION OF THE DRAWINGS

FIG. 1, is a plan view of an illustrative circuit pattern formed on a plastic masking sheet, by cutting, burning, or laser action.

FIG. 2, is a sectional view taken on line 2—2 in FIG. 1.

FIG. 3, is a sectional view taken in the same direction as FIG. 2, but after excess material has been removed from the masking sheet.

FIG. 4, is a plan view of the FIG. 3 masking sheet, after attachment thereof to a transfer tape.

FIG. 5, is a sectional view taken on line 5—5 in FIG. 4.

FIG. 6, is a view taken in the same direction as FIG. 5, but showing the tape and pattern lifted away from a glossy support surface.

FIG. 7, is a plan view of the tape and pattern of FIG. 6, transferred onto the conductive surface of a circuit board.

FIG. 8, is a sectional view taken on line 8—8 in FIG. 7.

FIG. 9, is a sectional view taken in the same direction as FIG. 8, but showing the circuit pattern after the transfer tape has been removed. The tape is not visible in FIG. 9.

FIG. 10, is a view taken in the direction of FIG. 9, but after exposed areas of the conductive film on the circuit board have been removed, as by acid etching.

FIG. 11, shows the final circuit board after removal of the pattern form the conductive film.

FIG. 12, is a plan view of the FIG. 11 circuit board.

DESCRIPTION OF THE PREFERRED EMBODIMENTS OF THE PRESENT INVENTION

Figure 13:
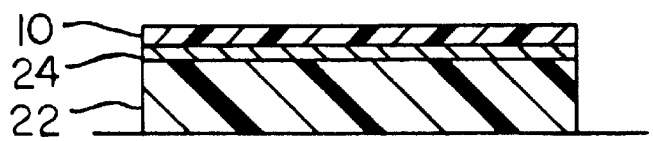
FIG. 13, is a sectional view, taken through a sheet arranged directly on a circuit board, so that a mask can be formed on the conductive film of the circuit board.

FIG. 1, is a plan view of an illustrative circuit pattern formed on a plastic masking sheet, by cutting, burning, or laser action.

FIG. 2, is a sectional view taken on line 2—2 in FIG. 1.

FIGS. 1 and 2, show a sheet of masking material 10 adhesively secured to a flat substrate surface 12. In FIG. 2, the lower face of sheet 10 is a pre-coated with a first contact adhesive 15, whereby sheet 10 is releasably secured to support surface 12. Support surface 12 is glossy (non-porous), whereby the surface acts as a release surface at a subsequent point in the manufacturing cycle.

FIG. 3, is a sectional view taken in the same direction as FIG. 2, but after excess material has been removed from the masking sheet.

A cutting mechanism is applied to the exposed (upper) surface of sheet 10, to form a pattern 16 in the sheet. The cutting mechanism can be a manually operated knife, or (in a more elaborate system) a plotter cutter, a low power laser controlled by a computer that is connected to a scanner trained on a drawing of the desired circuit pattern. High pressure water cutting techniques can also be employed. In any event, the cutting mechanism cuts through selected lines or areas 17 of sheet 10 to form a circuit pattern 16 (FIG. 3).

The excess areas of sheet 10 are manually removed, e.g. by a sharp-edged instrument, so as to leave pattern 16 on glossy surface 12. Sheet 10 may be formed of various materials having the capability to be cut cleanly, to form sharp edges defining desired patterns. A preferred material for sheet 10 is a vinyl plastic material having a thickness of about 0.008 inch. This material is flexible, and has the ability to be cut easily so as to form clear sharp edges. Rigid sheet materials of a desired thickness can also be used.

FIG. 4, is a plan view of the FIG. 3 masking sheet, after attachment thereof to a transfer tape.

FIG. 5, is a sectional view taken on line 5—5 in FIG. 4.

FIG. 6, is a view taken in the same direction as FIG. 5, but showing the tape and pattern lifted away from a glossy support surface.

With pattern 16 still on glossy surface 12, a transfer tape 18 is pressed onto the exposed surface of the pattern, as shown in FIGS. 4 and 5. The lower surface of tape 18 has a second contact adhesive coating 20 thereon, whereby the tape can be used to lift pattern 16 off the glossy surface 12, as shown in FIG. 6. Tape 18 can be a paper sheet of about 0.008 inch thickness, coated on one surface with a gum-type contact adhesive. The use of an adhesive tape for transferring a mask has been previously employed, but not in this specific process.

The contact adhesive 20 on tape 18 preferably is weaker than adhesive coating 15 on pattern 16. However, release surface 12 effectively diminishes the adhesive properties of adhesive 20, so that tape 18 is enabled to lift pattern 16 from surface 12, as shown in FIG. 6.

FIG. 7, is a plan view of the tape and pattern of FIG. 6, transferred onto the conductive surface of a circuit board.

FIG. 8, is a sectional view taken on line 8—8 in FIG. 7.

As the next step in the process, tape 18 (with the attached pattern 16) is moved to a position overlying a dielectric board 22 (FIGS. 7 and 8). Board 22 (formed of a suitable non-conductive plastic material) has a thin film of conductive material 24 on its upper surface. Typically the conductive film 24 is formed of copper in a thickness of about 0.005 inch. However, the film thickness is not a critical part of the invention; the conductive film can be of varying thickness, dependent partly on the conductive material being used. Dielectric board 22 is preferably a relatively rigid plastic material having a thickness of about 0.08 inch (i.e. many times the thickness of the copper film). Typically, board 22 is formed of a phenolic or glass epoxy material. The copper film preferably covers the entire surface of board 22.

FIG. 9, is a sectional view taken in the same direction as FIG. 8, but showing the circuit pattern after the transfer tape has been removed. The tape is not visible in FIG. 9.

FIG. 10, is a view taken in the direction of FIG. 9, but after exposed areas of the conductive film on the circuit board have been removed, as by said etching.

After tape 18 has been pressed downwardly to place pattern 16 on conductive film 24 (as shown in FIG. 8), the tape 18 is lifted upwardly to separate the tape from pattern (mask) 16. The adhesive coating 15 on the lower face of pattern 16 causes the pattern to remain on conductive film 24 when a manual lifting force is applied to tape 18. FIG. 9, shows pattern 16 on film 24, after tape 18 has been lifted off the pattern.

With pattern 16 still on the conductive film 24, the exposed areas of film 24 are acid-etched to form a conductive film having the shape of pattern 16. The acid-etching process removes the exposed areas of conductive film 24, but does not attack the film areas underneath pattern 16. FIG. 10, shows the condition of conductive film 24 after the etching process. During the etching process the vinyl plastic pattern material becomes relatively brittle, so that it can be readily removed from the surface of conductive film 24 after the etching step.

Acid etching is the preferred method of removing the excess conductive film. However, it is believed that other methods could be used, e.g. sand blasting.

FIG. 11, shows the final circuit board after removal of the pattern from the conductive film.

FIG. 12, is a plan view of the FIG. 11 circuit board.

As the final step in the method, the mask (pattern) 16 is removed from the printed circuit formed by the etching step. FIGS. 11 and 12, show the final condition of the circuit board.

FIGS. 13 through 16, illustrate another method of practicing the invention. In this case the pattern (mask) is formed directly on conductive film 24, thereby eliminating the steps of removing the pattern from substrate 12 and transferring the pattern onto conductive film 24.

FIG. 13, is a sectional view, taken through a sheet arranged directly on a circuit board, so that a mask can be formed on the conductive film of the circuit board.

FIG. 13, shows sheet 10 adhesively attached to conductive film 24 (prior to cutting through sheet 10 to form the pattern). A mask (pattern) 16 is formed on conductive film 24 by cutting through selected areas (lines) of sheet 10, e.g. with a cutting implement, plotter cutter, or low power laser. The excess sheet 10 material is removed to achieve the pattern depicted in FIG. 14.

Figure 14:
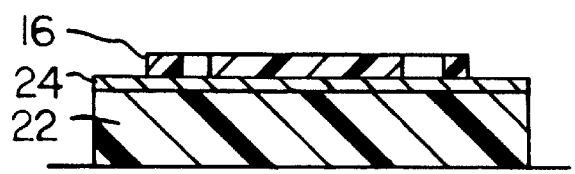
FIG. 14, is a sectional view, taken in the same direction as FIG. 13, but showing the sheet after the pattern has been formed on the conductive film.

FIG. 14, is a sectional view, taken in the same direction as FIG. 13, but showing the sheet after the pattern has been formed on the conductive film.

Figure 15:
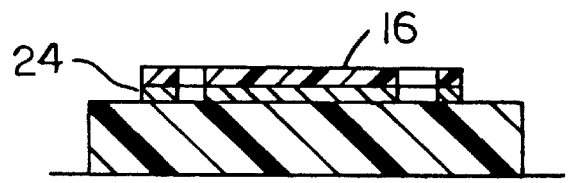
FIG. 15, is a sectional view, taken in the same direction as FIG. 14, but showing the conductive film after removal of exposed areas of the film material.

FIG. 15, is a sectional view, taken in the same direction as FIG. 14, but showing the conductive film after removal of exposed areas of the film material.

FIG. 14, duplicates the condition depicted in FIG. 9. Exposed areas of film 24 are etched, or otherwise removed to form a conductive film having the configuration of pattern (mask) 16. FIG. 15, shows the circuit board after the etching process.

Figure 16:
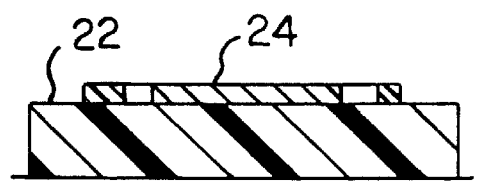
FIG. 16, shows the final circuit board after removal of the pattern from the conductive film depicted in FIG. 15.

FIG. 16, shows the final circuit board after removal of the pattern from the conductive film depicted in FIG. 15.

The pattern 16 is removed from conductive film to achieve the final product depicted in FIG. 16. FIG. 16, corresponds to FIG. 11 in the previously described procedure.

It will be seen that the process can be formed without special dies or tools. A low cost cutting implement can be used to form the circuit pattern in masking sheet 10. The masking sheet can be a low cost plastic material that is readily cut to form various intricate patterns.

However, it will be appreciated by those skilled in the arts pertaining thereto, that the present invention can be practiced in various alternate forms, proportions, and configurations. Further, the previous detailed description of the preferred embodiment of the present invention are presented for purposes of clarity of understanding only, and no unnecessary limitations should be implied therefrom. Finally, all appropriate mechanical and functional equivalents to the above, which may be obvious to those skilled in the arts pertaining thereto, are considered to be encompassed within the claims of the present invention.

What is claimed is:

1. A method of forming a printed circuit on a dielectric board comprising:

a. cutting a circuit pattern out of a flexible sheet, wherein said sheet has a first contact adhesive on a first major face thereof;

b. pressing a tape against a second major face of said pattern, wherein said tape has a second contact adhesive on the tape surface that is engaged with the pattern;

c. pressing the tape and pattern against a conductive film on a dielectric circuit board, whereby said first contact adhesive secures the pattern to the conductive film;

d. separating the tape from the pattern leaving the pattern on the conductive film;

e. etching exposed areas of the conductive film, to form a conductive layer underneath the pattern; and f. removing the pattern from the conductive layer.

2. The method, as described in claim 1, wherein the first contact adhesive is stronger than the second adhesive.

3. The method, as described in claim 1, wherein said circuit board is formed out of a rigid plastic material, and said conductive film is copper.

4. The method, as described in claim 3, wherein the first contact adhesive is stronger than the second contact adhesive.

5. A method of forming a printed circuit on a dielectric board, comprising:

a. applying a first contact adhesive to a first major surface of a flexible masking sheet;

b. temporarily attaching the masking sheet to a glossy surface by bringing the adhesive surface of the sheet into engagement with the glossy surface;

c. cutting a circuit pattern out of said masking sheet;

d. removing areas of said masking sheet, leaving a pattern on the glossy surface;

e. providing a tape having a second contact adhesive on one of the tape major surfaces;

f. bringing the tape into contact with the pattern so that the second contact adhesive is engaged with the exposed surface of the pattern;

g. lifting the tape and pattern off the glossy surface;

h. providing a dielectric circuit board with a conductive film on a major surface of the board;

i. transferring the tape and pattern to the circuit board by bringing the adhesive surface of the pattern into engagement with the conductive film;

j. removing the tape from the pattern, leaving the pattern adhesively attached to the conductive film;

k. etching the exposed areas of the conductive film, to form a conductive layer underneath the pattern; and l. removing the pattern from the conductive layer.

* * * * *